United States Patent
Cho

(10) Patent No.: US 8,254,185 B2
(45) Date of Patent: Aug. 28, 2012

(54) SEMICONDUCTOR DEVICE FOR GENERATING INTERNAL VOLTAGE AND MEMORY SYSTEM INCLUDING THE SEMICONDUCTOR DEVICE

(75) Inventor: Yong-ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 270 days.

(21) Appl. No.: 12/700,383

(22) Filed: Feb. 4, 2010

(65) Prior Publication Data
US 2010/0194412 A1 Aug. 5, 2010

(30) Foreign Application Priority Data
Feb. 4, 2009 (KR) .................. 10-2009-0008852

(51) Int. Cl.
*G11C 7/06* (2006.01)
(52) U.S. Cl. .................. 365/189.07; 365/226
(58) Field of Classification Search ............ 365/189.07, 365/226, 227; 327/530, 535, 538
See application file for complete search history.

(56) References Cited

U.S. PATENT DOCUMENTS

| | | | |
|---|---|---|---|
| 5,689,460 A * | 11/1997 | Ooishi | 365/189.07 |
| 5,821,808 A * | 10/1998 | Fujima | 327/541 |
| 5,929,696 A * | 7/1999 | Lim et al. | 327/540 |
| 6,198,683 B1 | 3/2001 | Ishii et al. | |
| 6,392,951 B2 | 5/2002 | Fujima et al. | |
| 6,798,276 B2 * | 9/2004 | Mori et al. | 327/541 |
| 7,049,881 B2 * | 5/2006 | Moon et al. | 327/541 |
| 7,365,595 B2 * | 4/2008 | Lee | 327/538 |
| 2003/0038617 A1 * | 2/2003 | Yaklin | 323/304 |

FOREIGN PATENT DOCUMENTS

| | | |
|---|---|---|
| JP | 2001-266573 A | 9/2001 |
| KR | 10-2000-0077268 A | 12/2000 |
| KR | 10-2004-0082894 A | 9/2004 |
| KR | 10-2005-0118808 A | 12/2005 |

* cited by examiner

*Primary Examiner* — Vu Le
(74) *Attorney, Agent, or Firm* — Lee & Morse, P.C.

(57) ABSTRACT

A semiconductor device includes a comparator, an internal voltage generator, a control signal generator, and a selector. The comparator may compare a reference voltage to an internal voltage and output a comparison signal. The internal voltage generator may generate and output the internal voltage in response to the comparison signal. The control signal generator may generate a control signal. The selector may receive first and second target voltages, and select and output one of the first and second target voltages as the reference voltage in response to the control signal.

14 Claims, 8 Drawing Sheets

SEMICONDUCTOR DEVICE FOR GENERATING INTERNAL VOLTAGE AND MEMORY SYSTEM INCLUDING THE SEMICONDUCTOR DEVICE

BACKGROUND

1. Field

Example embodiments relate to a semiconductor device and a memory system, and more particularly, to a semiconductor device for generating an internal voltage and a memory system including the semiconductor device.

2. Description of the Related Art

A semiconductor device may generate an internal voltage and may provide the internal voltage to a memory cell array or a peripheral circuit of the memory cell array. However, the internal voltage may decrease when current consumption increases. For example, when a sensing operation is performed on a bit line in the memory cell array, the internal voltage provided to the memory cell array may decrease, thereby reducing operation speed of the memory cell array.

SUMMARY

Embodiments are therefore directed to a semiconductor device for generating an internal voltage and a memory system including the same, which substantially overcome one or more of the problems due to the limitations and disadvantages of the related art.

According to an aspect of the inventive concept, there is provided a semiconductor device including a comparator that compares a reference voltage to an internal voltage and outputs a comparison signal, an internal voltage generator that generates and outputs the internal voltage in response to the comparison signal, a control signal generator that generates a control signal, and a selector that receives first and second target voltages, and selects and outputs one of the first and second target voltages as the reference voltage in response to the control signal.

In response to the control signal, the selector may select the first target voltage in a period for performing an over-driving operation and select the second target voltage in a period for performing a sensing operation.

In response to the control signal, the selector may select the first target voltage in a period for performing an over-driving operation and in a predetermined period after a sensing operation starts, and select the second target voltage in a period for performing the sensing operation not including the predetermined period.

The comparator may include a current controller that controls a bias current of the comparator in response to the control signal.

According to another aspect of the inventive concept, there is provided a memory system including a memory device that includes the above semiconductor device, and a controller that controls the memory device, wherein the memory device uses an internal voltage output from the semiconductor device.

According to another aspect of the inventive concept, there is provided a semiconductor device including a comparator that compares a reference voltage to a comparison voltage and outputs a comparison signal, an internal voltage generator that generates and outputs an internal voltage in response to the comparison signal, a control signal generator that generates a control signal, and a voltage divider that outputs a voltage obtained by voltage dividing the internal voltage as the comparison voltage in response to the control signal in a first logic state, and outputs the internal voltage as the comparison voltage in response to the control signal in a second logic state, wherein the control signal generator generates the control signal in the first logic state in a period for performing an over-driving operation and a predetermined period after a sensing operation starts, and in the second logic state in a period for performing the sensing operation not including the predetermined period.

The control signal generator may generate the control signal in the first logic state from a time when a predetermined command is received until a time when the internal voltage becomes the same as or less than the reference voltage after the sensing operation starts.

The comparator may include a current controller that controls a bias current of the comparator in response to the control signal.

According to another aspect of the inventive concept, there is provided a memory system including a memory device that includes the above semiconductor device, and a controller that controls the memory device, wherein the memory device uses an internal voltage output from the semiconductor device.

According to another aspect of the inventive concept, there is provided a semiconductor device including a comparator that compares a reference voltage to a comparison voltage and outputs a comparison signal, an internal voltage generator that generates and outputs an internal voltage in response to the comparison signal, a control signal generator that generates a control signal in a first logic state in a period for performing an over-driving operation and in a second logic state in a period for performing a sensing operation, and a voltage divider that outputs a voltage obtained by voltage dividing the internal voltage as the comparison voltage in response to the control signal in the first logic state, and outputs the internal voltage as the comparison voltage in response to the control signal in the second logic state, wherein the comparator includes a current controller that controls a bias current of the comparator in response to the control signal.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
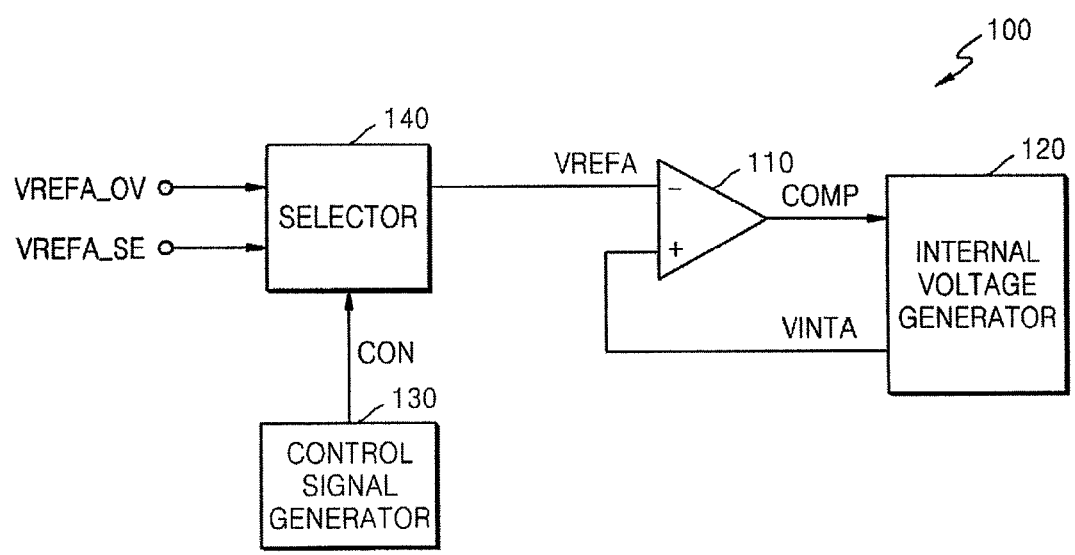
FIG. 1 illustrates a block diagram of a semiconductor device according to an embodiment.

Korean Patent Application No. 10-2009-0008852, filed on Feb. 4, 2009, in the Korean Intellectual Property Office, and entitled: "Semiconductor Device for Generating Internal Voltage and Memory System Including the Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when an element is referred to as being "between" two elements or "connected to" another element, it can be the only element between two elements or connected to another element, or one or more intervening elements may also be present. Like reference numerals refer to like elements throughout.

FIG. 1 illustrates a block diagram of a semiconductor device 100 according to an embodiment. Referring to FIG. 1, the semiconductor device 100 may include a comparator 110, an internal voltage generator 120, a control signal generator 130, and a selector 140.

The comparator 110 compares a reference voltage VREFA to an internal voltage VINTA and outputs a comparison signal COMP. The internal voltage generator 120 may generate and output the internal voltage VINTA in response to the comparison signal COMP. The control signal generator 130 may generate and output a control signal CON. The control signal CON may have logic states according to operations of the semiconductor device 100. Operation of the control signal generator 130 will be described in detail below with reference to FIGS. 3A and 3B.

The selector 140 may receive first and second target voltages VREFA_OV and VREF_SE, and may select and output one of the first and second target voltages VREFA_OV and VREF_SE as the reference voltage VREFA to the comparator 110 in response to the control signal CON. In the following descriptions, it is assumed that the first target voltage VREF_OV is a target voltage of the internal voltage VINTA when the semiconductor device 100 is in an over-driving operation, and that the second target voltage VREFA_SE is the target voltage of the internal voltage VINTA when the semiconductor device 100 is in a sensing operation. The over-driving operation refers to increase of the internal voltage VINTA by a predetermined amount before the sensing operation starts in order to compensate for a voltage drop that occurs in the sensing operation. Thus, the first target voltage VREFA_OV may have a higher voltage level than the second target voltage VREFA_SE. Operation of the selector 140, which selects one of the first and second target voltages VREFA_OV and VREF_SE in response to the control signal CON, will be described in detail below with reference to FIGS. 3A and 3B.

Figure 2:
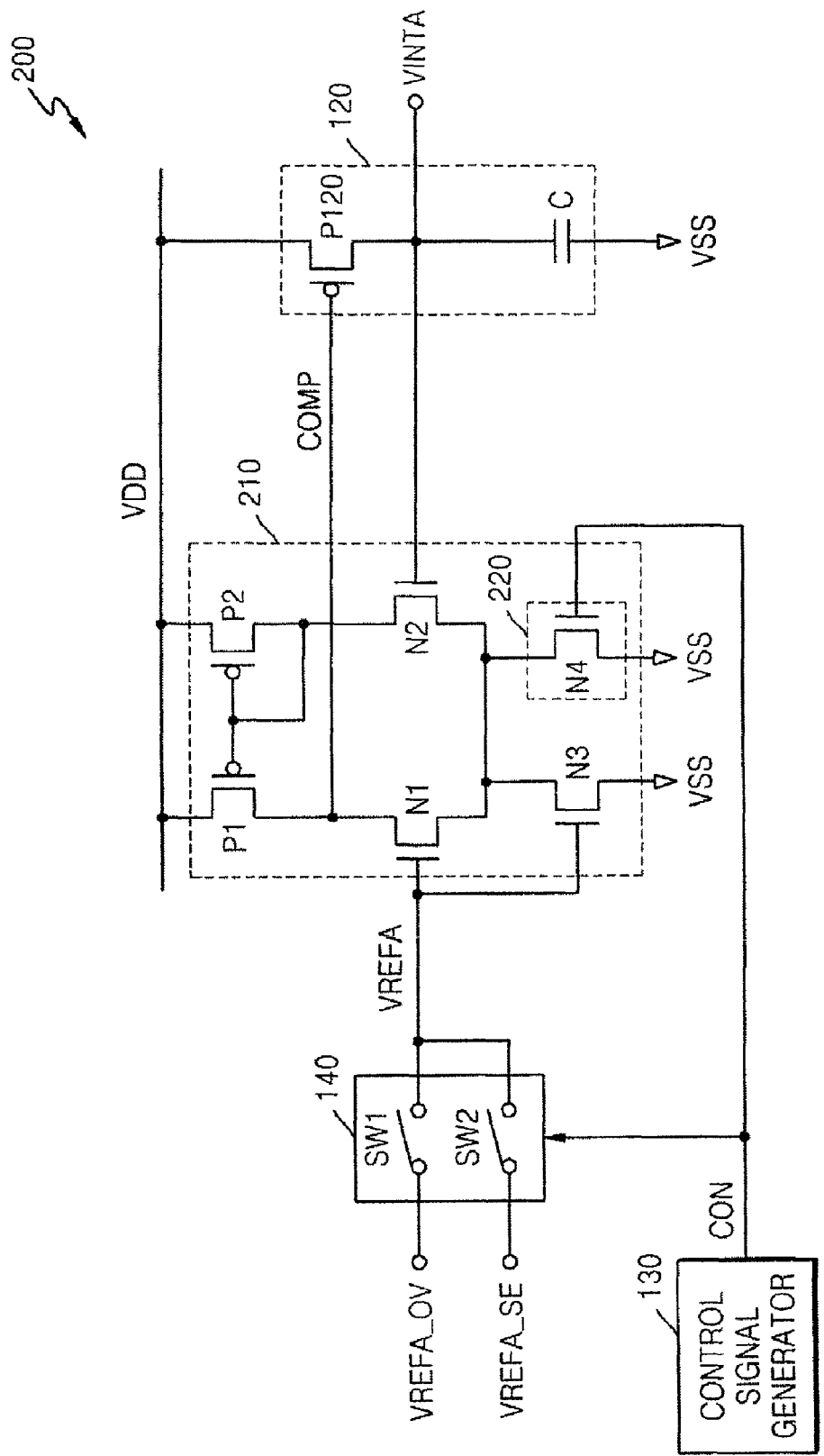
FIG. 2 illustrates a circuit diagram of a semiconductor device according to another embodiment.

FIG. 2 illustrates a circuit diagram of a semiconductor device 200 according to another embodiment. Some of the elements illustrated in FIG. 1 are implemented in FIG. 2 by using like reference numerals, and perform corresponding operations as described previously with reference to FIG. 1. However, the inventive concept is not limited to the circuit illustrated in FIG. 2 and may be implemented by using other elements as long as the operations described above in FIG. 1 are performed.

Referring to FIG. 2, the semiconductor device 200 may include a comparator 210, the internal voltage generator 120, the control signal generator 130, and the selector 140. The comparator 210 may include a current controller 220. For example, a semiconductor device according to example embodiments may include the comparator 110 illustrated in FIG. 1 or the comparator 210 including the current controller 220 illustrated in FIG. 2. The current controller 220 may control a bias current of the comparator 210 in response to the control signal CON. That is, a speed of performing the over-driving operation may be controlled by using the current controller 220.

As illustrated in FIG. 2, the comparator 210 may include first and second p-channel metal-oxide semiconductor (PMOS) transistors P1 and P2, and first through third n-channel metal-oxide semiconductor (NMOS) transistors N1 through N3. The first PMOS transistor P1 has a first port to which a power supply voltage VDD may be applied, a second port connected to an output port of the comparator 210, and a gate connected to a complementary output port of the output port of the comparator 210. The second PMOS transistor P2 has a first port to which the power supply voltage VDD may be applied, and a second port and a gate that may be connected to the complementary output port. The first NMOS transistor N1 has a first port connected to the output port of the comparator 210, a second port, and a gate to which the reference voltage VREFA may be applied. The second NMOS transistor N2 has a first port connected to the complementary output port of the comparator 210, a second port connected to the second port of the first NMOS transistor N1, and a gate to which the internal voltage VINTA may be applied. The third NMOS transistor N3 has a first port connected to the second ports of the first and second NMOS transistors N1 and N2, a second port to which a ground voltage VSS may be applied, and a gate to which the reference voltage VREFA may be applied.

The current controller 220 may include a current control transistor N4 having a first port connected to the first port of the third NMOS transistor N3, a second port to which the ground voltage VSS may be applied, and a gate to which the control signal CON may be applied. Although the current control transistor N4 is illustrated as an NMOS transistor in FIG. 2, the inventive concept is not limited thereto. Another element may be used in the current controller 220, as long as the element is turned on in response to the control signal CON so as to make a current flow in a predetermined period. Operation of the current controller 220 will be described in detail below with reference to FIGS. 3A and 3B.

The internal voltage generator 120 may include a transistor P120. The transistor P120 has a first port to which the power supply voltage VDD may be applied, a second port connected to an output port of the internal voltage generator 120, and a gate to which the comparison signal COMP may be applied. That is, as the transistor P120 is turned on or off in response to the comparison signal COMP, the internal voltage VINTA output by the internal voltage generator 120 may change accordingly. Also, the internal voltage generator 120 may further include a capacitor C between the second port of the transistor P120 and the ground voltage VSS.

The selector 140 may include a plurality of switches, e.g., first and second switches SW1 and SW2, which may operate in response to the control signal CON output by the control signal generator 130. That is, when one of the first and second switches SW1 and SW2 is turned on in response to the control signal CON, the reference voltage VREFA output by the selector 140 to the comparator 210 may be determined. For example, if the control signal generator 130 transmits a control signal CON at a high logic state into the selector 140, the first switch SW1 may close to transmit the first target voltage VREFA_OV as a reference voltage VREFA into the comparator 210. Accordingly, adjusting timing of transmittance of the first and second target voltages VREFA_OV and VREFA_SE with respect to beginning and end of the sensing operation may facilitate compensation of internal voltage drop during the sensing operation, e.g., without exceeding a predetermined internal voltage value.

Figure 3A:
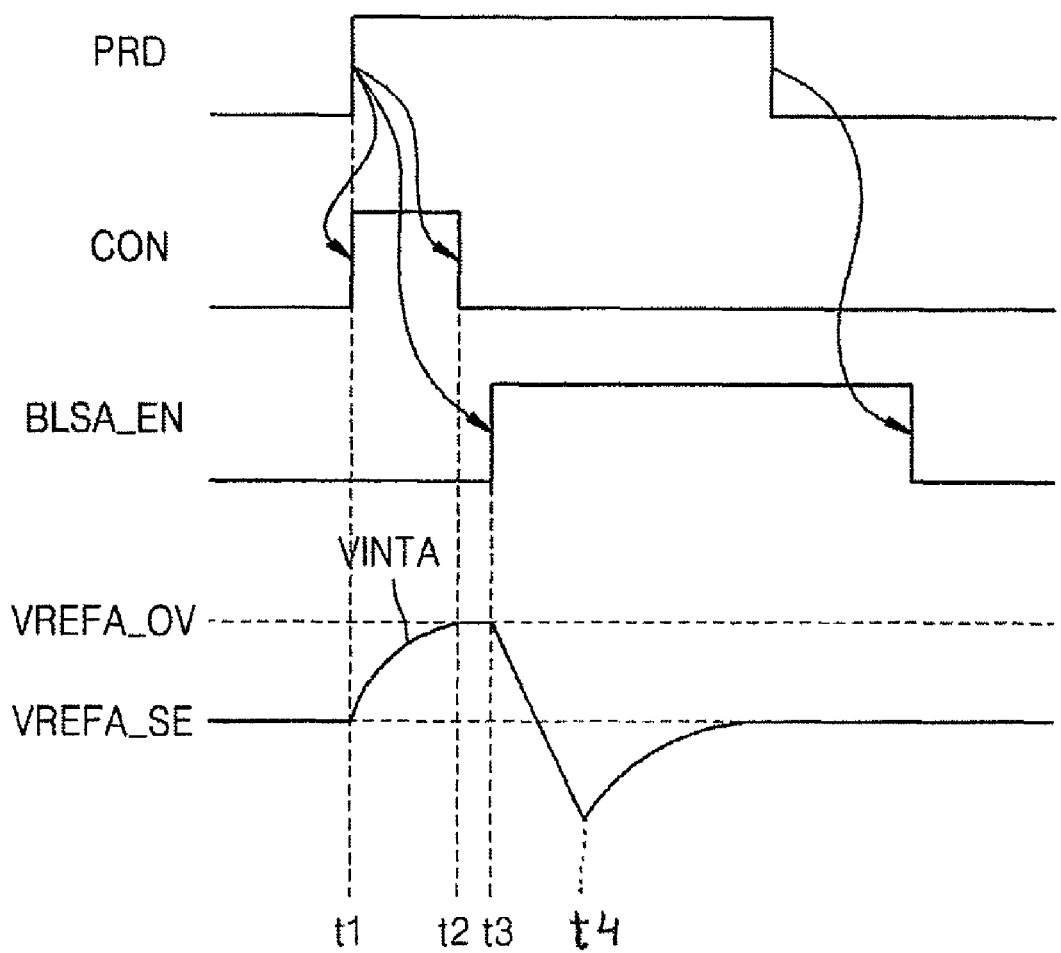
FIG. 3A illustrates a waveform diagram of an operation of a semiconductor device according to an embodiment.

FIG. 3A illustrates waveforms for describing operations of the semiconductor devices 100 and 200 illustrated in FIGS. 1 and 2 according to an embodiment of the inventive concept. Referring to FIG. 3A, a command (e.g., an active command) may be received at a time t1, e.g., a command to start a sensing operation. A logic state of the control signal CON may be changed at a time t2 in response to the command at the time t1, and a bit line sense amplifier enable signal BLSA_EN may be enabled at a time t3 to start the sensing operation. Although FIG. 3A illustrates time t2 as occurring prior to the time t3, the time t2 may be at the same time as the time t3.

In particular, referring to FIGS. 1, 2, and 3A, the control signal generator 130 may change the control signal CON to a first logic state at the time t1 when the command is received, and may change the control signal CON to a second logic state at the time t2 to start the sensing operation. That is, a period between the time t1 and the time t2 is an over-driving period. In the following descriptions, it is assumed that the first logic state is a logic high state and the second logic state is a logic low state. However, when the first logic state is a logic low state and the second logic state is a logic high state, the same effect of the inventive concept may also be achieved.

For example, as illustrated in FIG. 3A, at time t1, the control signal generator 130 may transmit a control signal CON at a logic high state to the selector 140. In response, the first switch SW1 of the selector 140 may close, and the selector 140 may output the first target voltage VREFA_OV as the reference voltage VREFA to the comparator 210. That is, only the first switch SW1 may be maintained at an "on" state if the control signal CON is in the first logic state, e.g., logic high state, and only the second switch SW2 may be maintained at the "on" state if the control signal CON is in the second logic state, e.g., logic low state.

In the period between the time t1 and the time t2, i.e., the period in which the over-driving operation is performed, the reference voltage VREFA may be maintained at the first target voltage VREFA_OV, and thus the internal voltage VINTA may increase, e.g., from VREFA_SE, to the first target voltage VREFA_OV. In the period between the time t1 and the time t2, the current control transistor N4 of the current controller 220 may be turned on by the control signal CON, so the bias current may increase. Accordingly, the speed of performing the over-driving operation may be improved.

As further illustrated in FIG. 3A, at time t2, the control signal generator 130 may change the logic state of the control signal CON, e.g., into a logic low state, to start the sensing operation. In response, the first switch SW1 of the selector 140 may open and the second switch SW2 may close, so the selector 140 may output the second target voltage VREFA_SE as the reference voltage VREFA to the comparator 210.

If the time t2 is prior to the time t3, at the time t2, the internal voltage VINTA may be equal to the first target voltage VREFA_OV, and the reference voltage VREFA may be changed into the second target voltage VREFA_SE. However, since the sensing operation is not performed between the time t2 and the time t3 and the capacitor C is connected between the ground voltage VSS and the output port of the internal voltage generator 120, the voltage level of the internal voltage VINTA may be maintained at the first target voltage VREFA_OV.

The sensing operation may start at the time t3 when the bit line sense amplifier enable signal BLSA_EN is generated, and thus the internal voltage VINTA may start to drop, e.g., between time t3 and time t4, due to increased current consumption during the sensing operation. The reference voltage VREFA may be maintained at the second target voltage VREFA_SE after the time t2, e.g., between time t2 and time t4, so the decreased internal voltage VINTA, i.e., due to the sensing operation, may start increasing at time t4 until it reaches the second target voltage VREFA_SE. As illustrated in FIG. 3A, after the decreased internal voltage VINTA increases to the second target voltage VREFA_SE, i.e., a predetermined period after time t4, the internal voltage VINTA may be substantially maintained at the second target voltage VREFA_SE during a remainder of the sensing operation.

Figure 3B:
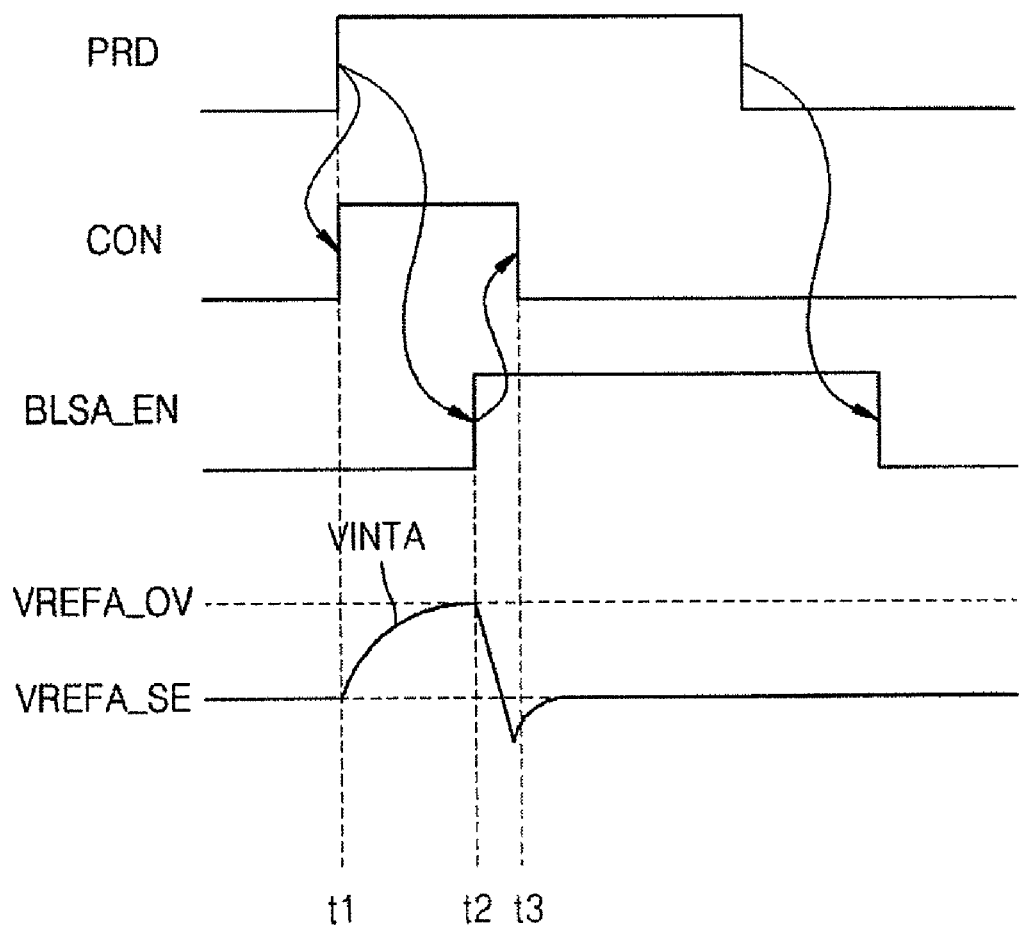
FIG. 3B illustrates a waveform diagram of an operation of a semiconductor device according to another embodiment.

FIG. 3B illustrates waveforms for describing operations of the semiconductor devices 100 and 200 illustrated in FIGS. 1 and 2 according to another embodiment of the inventive concept.

Referring to FIGS. 1, 2, and 3B, a command (e.g., an active command) may be received at a time t1, and a bit line sense amplifier enable signal BLSA_EN may be enabled at a time t2 to start the sensing operation. In other words, the control signal generator 130 may change the control signal CON to a first logic state at the time t1 when the command is received, and may change the control signal CON to a second logic state at a time t3, i.e., a predetermined period after the time t2. Accordingly, the control signal CON may be at the first logic when the sensing operation starts, e.g., the control signal CON may be maintained at the first logic state during a portion of the sensing operation. That is, the control signal CON may be maintained at the first logic state in a period between the time t1 and the time t2, in which the over-driving operation is performed, and in a period between the time t2 and the time t3, which is a predetermined period after the sensing operation starts.

The selector 140 may output the first target voltage VREFA_OV as the reference voltage VREFA if the control signal CON is in the first logic state, and may output the second target voltage VREFA_SE as the reference voltage VREFA if the control signal CON is in the second logic state. That is, only the first switch SW1 may be maintained in an on state if the control signal CON is in the first logic state, and only the second switch SW2 may be maintained in the on state if the control signal CON is in the second logic state.

In the period between the time t1 and the time t2, i.e., the period in which the over-driving operation is performed, the reference voltage VREFA is maintained at the first target voltage VREFA_OV, and thus the internal voltage VINTA may increase to the first target voltage VREFA_OV. The sensing operation starts at the time t2, and thus, the internal voltage VINTA may start to drop. However, since the control signal CON is maintained at the first logic state until time t3, the reference voltage VREFA may be maintained at the first target voltage VREFA_OV until the time t3. Therefore, the power supply voltage VDD may be continuously applied to the internal voltage generator 120 between times t2 and t3. In other words, in comparison to the embodiment illustrated in FIG. 3A, i.e., where the internal voltage generator 120 operates only after the internal voltage VINTA drops below the second target voltage VREFA_SE, the internal voltage generator 120 in the embodiment of FIG. 3B may continuously operate even after the time t2, i.e., when the internal voltage VINTA drops below the first target voltage VREFA_OV. Thus, according to the embodiment of FIG. 3B, the internal voltage VINTA may have a smaller voltage drop, e.g., relative to the second target voltage VREFA_SE, and may increase faster to the second target voltage VREFA_SE, as compared to the embodiment of FIG. 3A.

Also, in a period between the time t1 and the time t3, the current control transistor N4 of the current controller 220 may be turned on. Therefore, the bias current may increase, so the speed of performing the over-driving operation may be improved.

Figure 4:
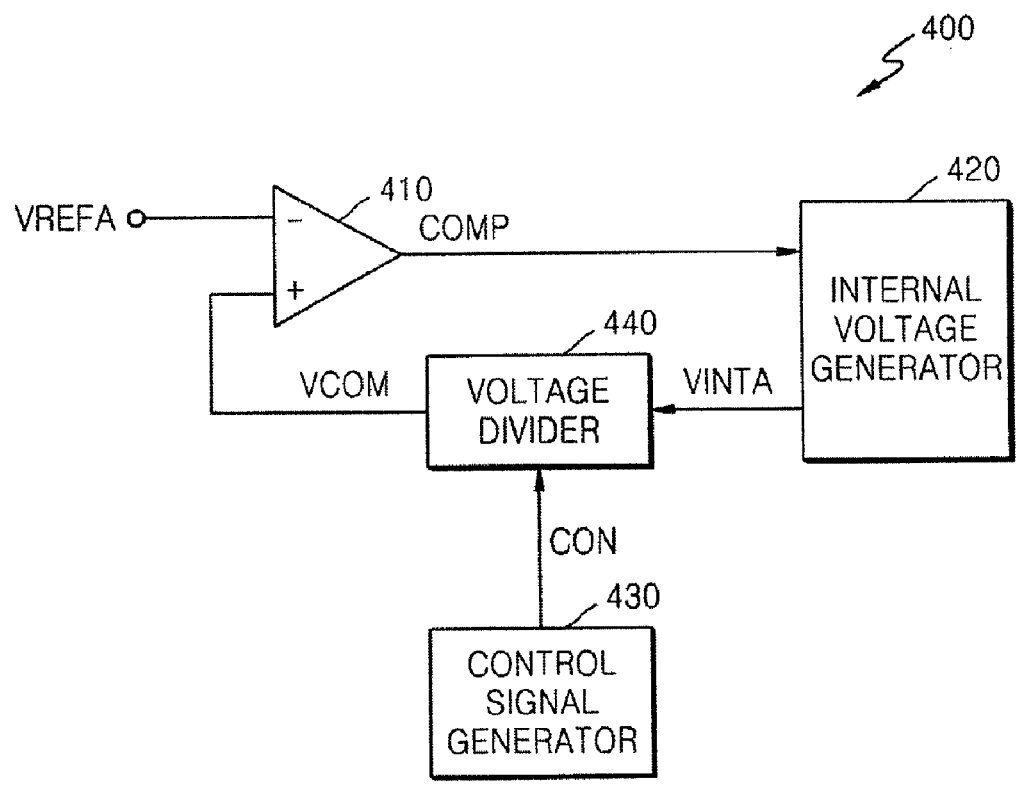
FIG. 4 illustrates a block diagram of a semiconductor device according to another embodiment.

FIG. 4 illustrates a block diagram of a semiconductor device 400 according to another embodiment. Referring to FIG. 4, the semiconductor device 400 may include a comparator 410, an internal voltage generator 420, a control signal generator 430, and a voltage divider 440.

The comparator 410 may compare a reference voltage VREFA to a comparison voltage VCOM output from the voltage divider 440, and may output a comparison signal COMP. The internal voltage generator 420 may generate and output an internal voltage VINTA in response to the comparison signal COMP. The control signal generator 430 may generate and output a control signal CON. The control signal CON may have different logic states according to operation of the semiconductor device 400. The control signal generator 430 may output the control signal CON in a first logic state in a first period, i.e., when an over-driving operation is performed, and in a second period, i.e., a predetermined time after a sensing operation starts. The control signal generator 430 may output the control signal CON in a second logic state in periods other than the first and second periods, e.g., a third period when the sensing operation is performed.

The voltage divider 440 may output either the internal voltage VINTA or a divided internal voltage VINTA as a comparison voltage VCOM to the comparator 410 in response to the control signal CON. That is, when the control signal CON is at the first logic state, the voltage divider 440 may output voltage obtained by voltage dividing the internal voltage VINTA, i.e., a portion of the voltage VINA, as the comparison voltage VCOM. When the control signal CON is at the second logic state, the voltage divider 440 may output the internal voltage VINTA, i.e., an entire voltage VINTA, as the comparison voltage VCOM. Operation of the semiconductor device 400 will be described in detail later with reference to FIG. 6.

Figure 5:
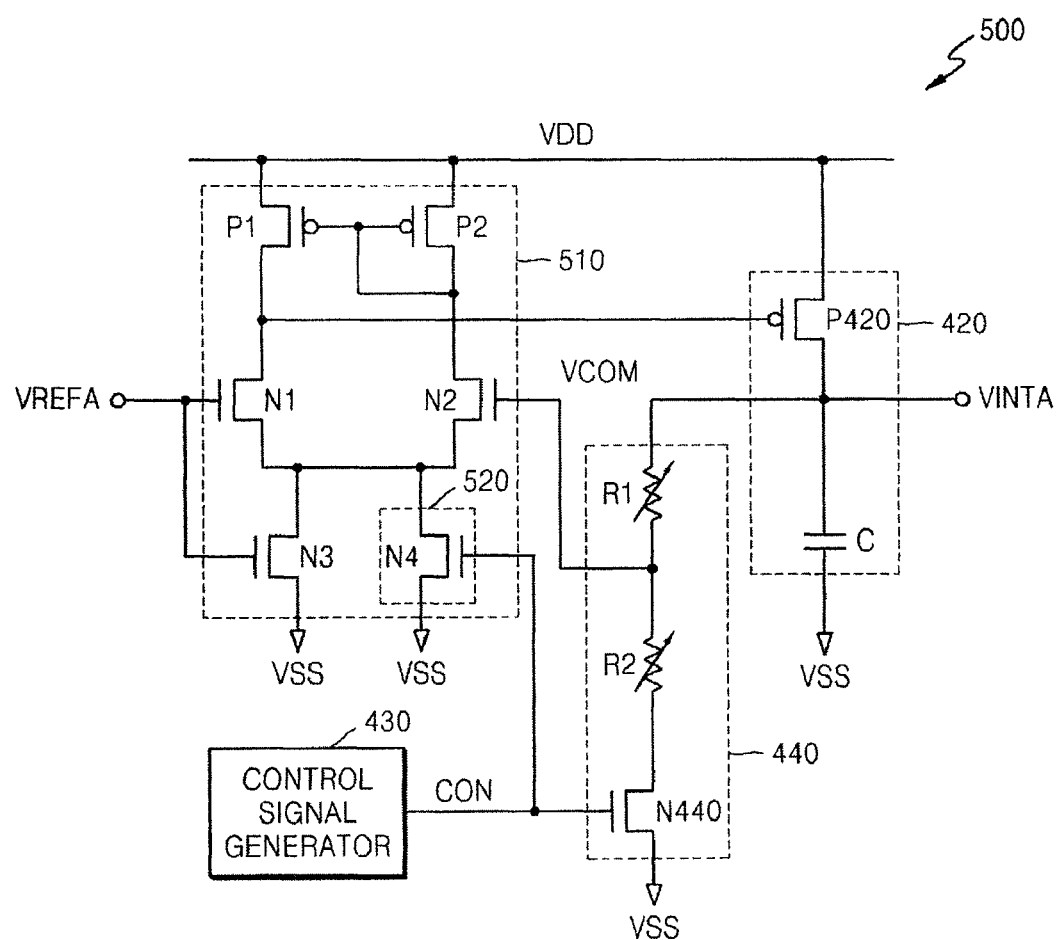
FIG. 5 illustrates a circuit diagram of a semiconductor device according to another embodiment.

FIG. 5 illustrates a circuit diagram of a semiconductor device 500 according to another embodiment. Some elements illustrated in FIG. 4 are implemented in the circuit of FIG. 5 by using like reference numerals. However, the inventive concept is not limited to the circuit illustrated in FIG. 5 and may be implemented by using other elements, as long as the operations described previously with reference to FIG. 4 are performed.

Referring to FIGS. 4 and 5, a comparator 510 may include a current controller 520. That is, a semiconductor device according to example embodiments may include, e.g., the comparator 410 illustrated in FIG. 4 or the comparator 510 including the current controller 520. The current controller 520 may control a bias current of the comparator 510 in response to the control signal CON. That is, the speed of performing the over-driving operation may be controlled by using the current controller 520.

The comparator 510 may include first and second PMOS transistors P1 and P2, and first through third NMOS transistors N1 through N3. The current controller 520 may include a current control transistor N4. The comparator 510 and the current controller 520 may have substantially same structures as the comparator 210 and the current controller 220, respectively, described previously with reference to FIG. 2, and thus, detailed descriptions thereof will be not be repeated. However, as indicated with reference to FIG. 2, the inventive concept is not limited to the current control transistor N4, illustrated as an NMOS transistor in FIG. 5, and any suitable elements may be used as long as the element may be turned on in response to the control signal CON to make current flow in a predetermined period. Operation of the current controller 520 will be described in detail below with reference to FIG. 6.

The internal voltage generator 420 may have a substantially same structure as the internal voltage generator 120 illustrated in FIG. 2. Thus, detailed descriptions thereof will not be repeated.

The voltage divider 440 may include a first resistive element R1, a second resistive element R2, and a transistor N440. The first resistive element R1 has a first port to which the internal voltage VINTA may be applied, and a second port connected to an output port of the voltage divider 440. The second resistive element R2 has a first port connected to the output port of the voltage divider 440. Each of the first and second resistive elements R1 and R2 may be a resistive element having a fixed resistance or a resistive element having a variable resistance. The transistor N440 has a first port connected to a second port of the second resistive element R2, a second port to which a ground voltage VSS may be applied, and a gate to which the control signal CON may be applied. Although the transistor N440 is illustrated as an NMOS transistor in FIG. 5, the inventive concept is not limited thereto. Another element may be used as long as the element may control connection between the second resistive element R2 and the ground voltage VSS in response to the control signal CON.

Figure 6:
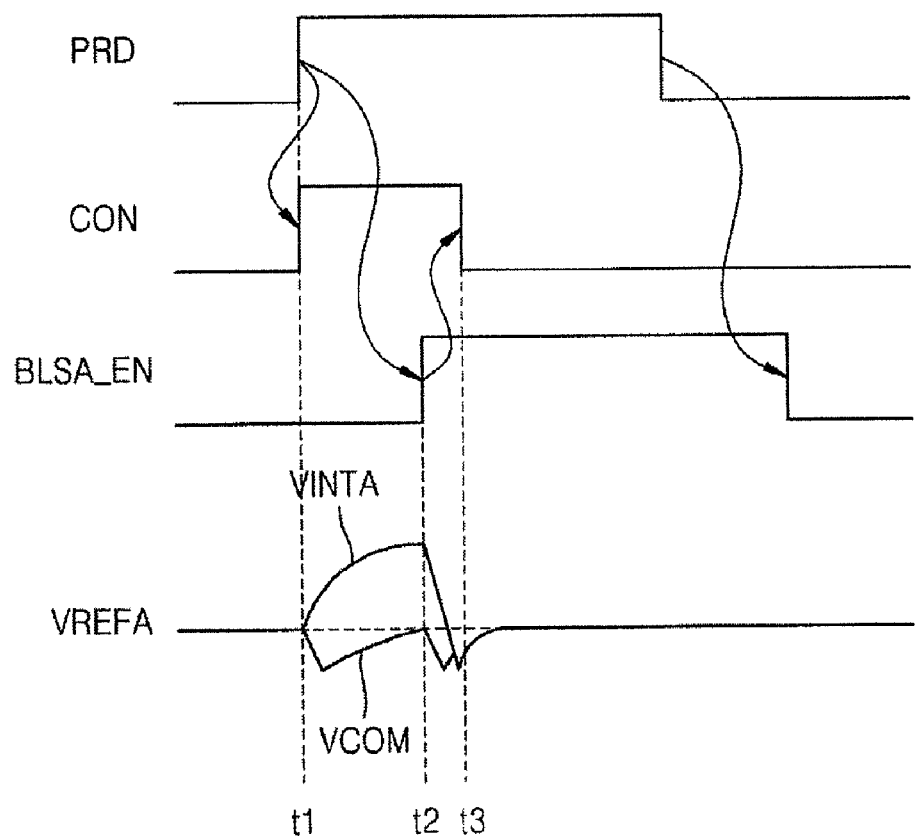
FIG. 6 illustrates a waveform diagram of an operation of a semiconductor device according to an embodiment.

FIG. 6 illustrates waveforms for describing operations of the semiconductor devices 400 and 500 illustrated in FIGS. 4 and 5, according to an embodiment of the inventive concept.

Referring to FIGS. 4-6, a command (e.g., an active command) may be received at a time t1, and a bit line sense amplifier enable signal BLSA_EN may be enabled at a time t2 to start the sensing operation. The control signal generator 430 may change the control signal CON to a first logic state at the time t1, i.e., beginning of the first period when the command is received, and may change the control signal CON to a second logic state at a time t3, i.e., a predetermined period after the time t2 to start the sensing operation. That is, the control signal CON may be maintained at the first logic state in a period between the time t1 and the time t2, in which the over-driving operation is performed, and in a period between the time t2 and the time t3, which is a predetermined period after the sensing operation starts.

If the control signal CON is in the first logic state, the voltage divider 440 may output a voltage obtained by voltage dividing the internal voltage VINTA as the comparison voltage VCOM. That is, if the control signal CON is at the first logic state, the transistor N440 may be maintained in an "on" state, and thus, the voltage divider 440 may output the voltage obtained by voltage dividing the internal voltage VINTA as the comparison voltage VCOM.

In the period between the time t1 and the time t2, i.e., the period in which the over-driving operation is performed, the comparison voltage VCOM may increase to the reference voltage VREFA. Since the sensing operation starts at the time t2, as illustrated in FIG. 6, the internal voltage VINTA starts to drop and the comparison voltage VCOM obtained by voltage dividing the dropping internal voltage VINTA also starts to drop. However, the comparison voltage VCOM is compared to the reference voltage VREFA until the time t3. Thus, a power supply voltage VDD may be continuously applied to the internal voltage generator 420. That is, the internal voltage generator 420 may operate not only after the internal voltage VINTA drops below the reference voltage VREFA, but may continuously operate even after the time t2 until the time t3. Thus, according to the current embodiment of FIG. 6, the internal voltage VINTA may drop less and may increase to the reference voltage VREFA faster in comparison to a conventional case.

Since the control signal CON is maintained in the second logic state after the time t3, the transistor N440 may be maintained at an "off" state, so the voltage divider 440 may output the internal voltage VINTA to the comparator 410. The internal voltage VINTA may be lower than the reference voltage VREFA at the time t3, so the internal voltage generator 420 may operate to increase the internal voltage VINTA to the reference voltage VREFA.

Also, as described above in FIG. 3A, the over-driving operation may be terminated before or when the sensing operation starts. Furthermore, as described above in FIG. 3B, in a period between the time t1 and the time t3, the current control transistor N4 of the current controller 420 is turned on, so the bias current may increase and the speed of performing the over-driving operation may be improved.

Figure 7:
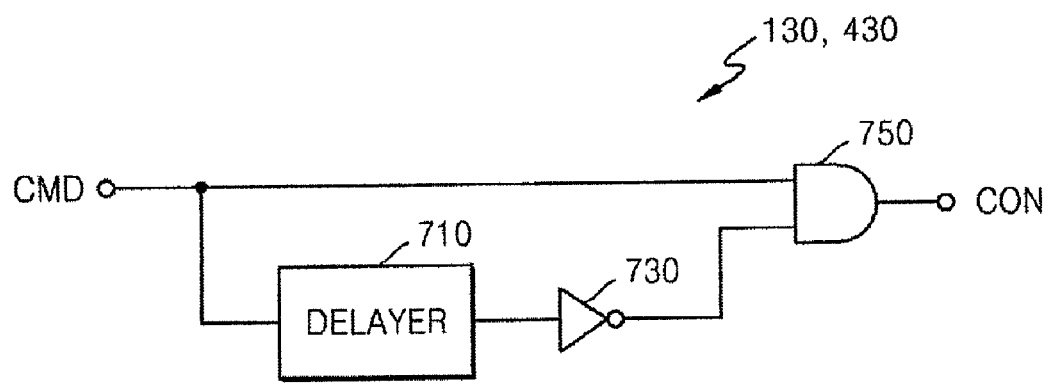
FIG. 7 illustrates a block diagram of a control signal generator according to an embodiment.

FIG. 7 illustrates a block diagram of the control signal generator 130 illustrated in FIG. 1 or the control signal generator 430 illustrated in FIG. 4 according to an embodiment of the inventive concept.

Referring to FIG. 7, the control signal generator 130 or 430 may include a delayer 710, an inverter 730, and an AND gate 750. The delayer 710 may delay a received command CMD before an output thereof. The received command may be an active command. For example, according to the embodiment of FIG. 3A, the delayer 710 may delay the received command CMD by a predetermined period before a sensing operation starts, e.g., the delayer 710 may delay the command CMD during performance of the over-driving operation. In another example, according to the embodiments of FIG. 3B or FIG. 6, the delayer 710 may delay and output the command by a period until a predetermined period after the sensing operation starts, e.g., the delayer 710 may delay the command CMD during performance of the over-driving operation and during a predetermined period after the sensing operation starts. For example, the predetermined period may mean a period until an internal voltage becomes the same as or less than the reference voltage after the sensing operation starts. If necessary, the delayer 710 may set different delay time of the command.

The inverter 730 may invert the command received from the delayer 710 and may output a corresponding output signal to the AND gate 750. The AND gate 750 may perform an AND operation on the command and the output signal of the inverter 730, and may output a corresponding signal as a control signal CON.

However, the structure of the control signal generator 130 or 430 is not limited to FIG. 7, and another element or another signal may be used as long as the control signal CON illustrated in FIG. 3A, FIG. 3B, or FIG. 6 may be generated.

Figure 8:
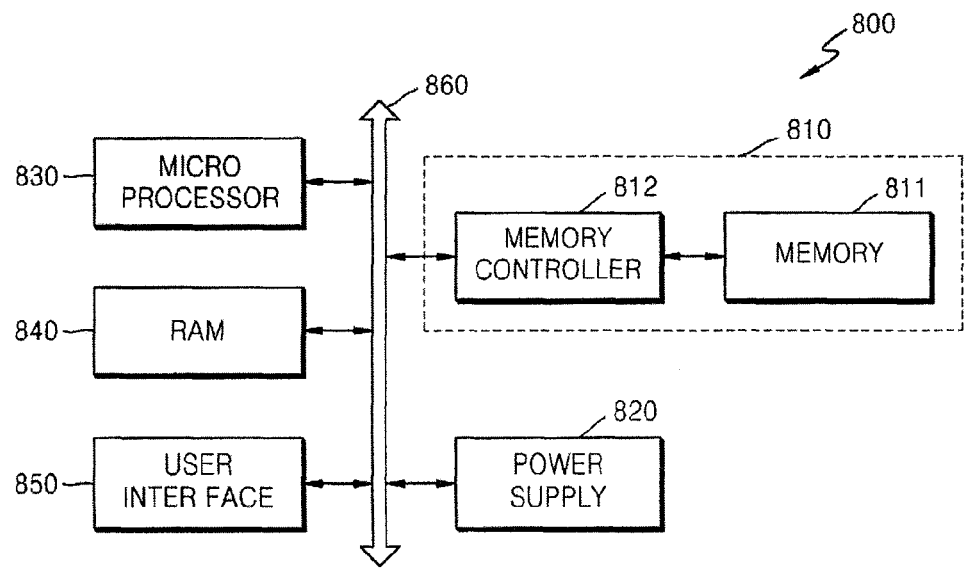
FIG. 8 illustrates a block diagram of a computing system including a semiconductor device according to an embodiment.

FIG. 8 illustrates a block diagram of a computing system 800 including a semiconductor device according to an embodiment of the inventive concept. Referring to FIG. 8, the computing system 800 may include a microprocessor 830, a user interface 850, and a memory system 810 including a memory controller 812 and a memory device 811, which are electrically connected to a bus 860. The memory device 811 may include one of the semiconductor devices 100, 200, 400, and 500 illustrated in FIGS. 1, 2, 4, and 5. That is, the memory device 811 may operate by using an internal voltage output from the included semiconductor device. The memory controller 812 may control the memory device 811. The computing system 800 may further include a random access memory (RAM) 840 and a power supply device 820.

If the computing system 800 is a mobile device, a modem for applying an operation voltage of the computing system 800, e.g., a battery or a baseband chipset, may further be included. Also, it is well-known to one of ordinary skill in the art that the computing system 800 may further include, e.g., an application chipset, a camera image processor (CIS), a mobile dynamic random access memory (DRAM), etc. Thus, detailed descriptions thereof will not be repeated. The memory controller 812 and the memory device 811 may form, e.g., a solid state drive/disk (SSD) that uses non-volatile memory for storing data.

Figure 9:
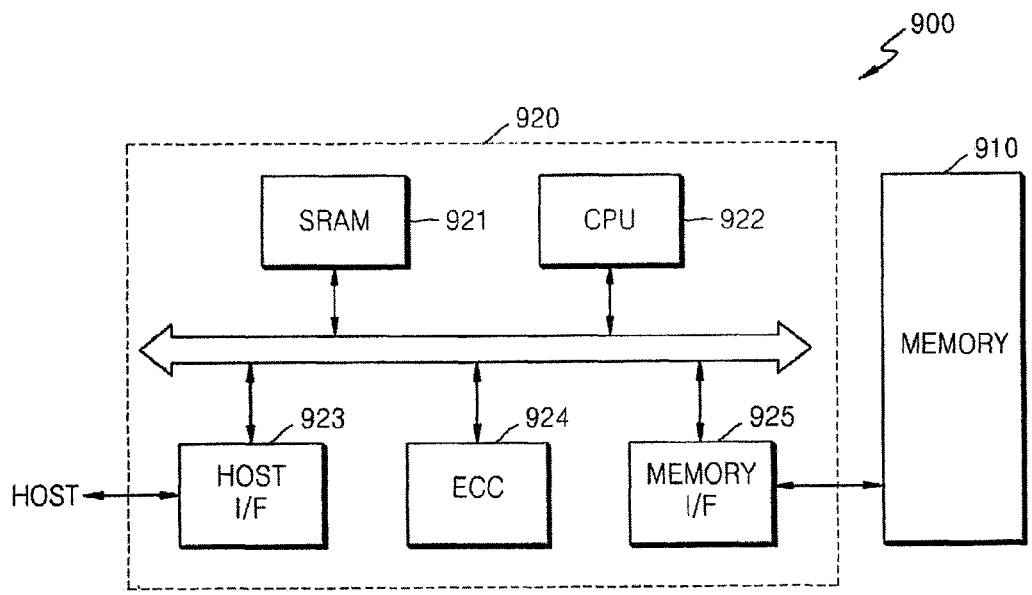
FIG. 9 illustrates a block diagram of a memory card including a semiconductor device according to an embodiment.

FIG. 9 illustrates a block diagram of a memory card 900 including a semiconductor device according to an embodiment of the inventive concept. Referring to FIG. 9, the memory card 900 may include a memory device 910 and a memory controller 920.

The memory device 910 may include one of the semiconductor devices 100, 200, 400, and 500 illustrated in FIGS. 1, 2, 4, and 5. That is, the memory device 910 may operate by using an internal voltage output from the included semiconductor device. The memory controller 920 may control the memory device 910. The memory controller 920 may be configured to communicate with an external device (e.g., a host) through various interface protocols, e.g., a universal serial bus (USB), a multimedia card (MMC), a peripheral component interconnect-express (PCI-E), serial advanced technology attachment (SATA), parallel advanced technology attachment (PATA), a small computer system interface (SCSI), an enhanced small disk interface (ESDI), and an integrated drive electronics (IDE). Structures and operations of a central processing unit (CPU) 922, a static random access memory (SRAM) 921, a host interface 923, an error correcting code (ECC) memory 924, a memory interface 925, and a bus 926, which are included in the memory controller 920, are well-known to one of ordinary skill in the art and thus detailed descriptions thereof will be omitted here.

The memory device 811 illustrated in FIG. 8 or the memory device 910 illustrated in FIG. 9 may be implemented by using various types of package, e.g., a package on package (POP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small-outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

According to example embodiments, when the internal voltage VINT is generated in a semiconductor device, a voltage drop of the internal voltage VINT during the sensing operation may be compensated by increasing the internal voltage VINT by a predetermined amount before providing the internal voltage, i.e., during an over-driving operation before the sensing operation. A reference voltage used for adjusting the internal voltage VINT during the over-driving and sensing operations according to example embodiments may be controlled, such that the internal voltage VINT may not exceed the reference voltage and the current in the circuit.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a comparator adapted to compare a reference voltage to an internal voltage and to output a comparison signal;
   an internal voltage generator adapted to generate and output the internal voltage in accordance with the comparison signal;
   a control signal generator adapted to generate a control signal; and
   a selector adapted to receive first and second target voltages, and to select and output one of the first and second target voltages as the reference voltage in accordance with the control signal,
   wherein the selector is adapted to select the first target voltage as the reference voltage when performing an over-driving operation and to select the second target voltage as the reference voltage when performing a sensing operation.

2. The semiconductor device as claimed in claim 1, wherein the selector is adapted to select the first target voltage as the reference voltage when performing the over-driving operation and during a predetermined period after starting the sensing operation, and to select the second target voltage as the reference voltage during the sensing operation not including the predetermined period.

3. The semiconductor device as claimed in claim 1, wherein the comparator includes a current controller adapted to control a bias current of the comparator in accordance with the control signal.

4. The semiconductor device as claimed in claim 3, wherein the comparator includes:
   a first transistor having a first port connected to an output port of the comparator and a gate connected to the reference voltage;
   a second transistor having a first port connected to a complementary output port of the output port, a second port connected to a second port of the first transistor, and a gate connected to an output of the internal voltage generator; and
   a third transistor having a first port connected to the second ports of the first and second transistors, a second port connected to a ground voltage, and a gate connected to the reference voltage,
   wherein the current controller includes a fourth transistor having a first port connected to the first port of the third transistor, a second port connected to the ground voltage, and a gate connected to the control signal.

5. A memory system, comprising:
   a memory device as claimed in claim 1;
   a controller adapted to control the memory device; and
   a semiconductor device in the memory device, the semiconductor device adapted to output an internal voltage to the memory device.

6. A semiconductor device, comprising:
   a comparator adapted to compare a reference voltage to a comparison voltage and to output a comparison signal;
   an internal voltage generator adapted to generate and output an internal voltage in accordance with the comparison signal;
   a control signal generator adapted to generate a control signal; and
   a voltage divider adapted to output a voltage obtained by voltage dividing the internal voltage as the comparison voltage in accordance with the control signal in a first logic state, and to output the internal voltage as the comparison voltage in accordance with the control signal in a second logic state,
   wherein the control signal generator generates the control signal in the first logic state during an over-driving operation and at a predetermined period after a sensing operation starts, and in the second logic state in a period for performing the sensing operation not including the predetermined period.

7. The semiconductor device as claimed in claim 6, wherein the control signal generator is adapted to generate the control signal in the first logic state from a time when a predetermined command is received until a time when the internal voltage becomes the same as or less than the reference voltage after the sensing operation starts.

8. The semiconductor device as claimed in claim 6, wherein the comparator includes a current controller adapted to control a bias current of the comparator in accordance with the control signal.

9. The semiconductor device as claimed in claim 6, wherein the voltage divider includes:
   a first resistive element connected between the internal voltage and a second an output port of the voltage divider;
   a second resistive element connected between the output port of the voltage divider and a transistor; and
   the transistor having a first port connected to the second resistive element, a second port connected to a ground voltage, and a gate connected to the control signal,
   wherein at least one of the first and second resistive elements is a resistive element having a fixed resistance or a resistive element having a variable resistance.

10. The semiconductor device as claimed in claim 6, wherein the control signal generator includes:
    a delayer adapted to delay a received predetermined command, the delayer being adapted to output the delayed predetermined command as an output signal;
    an inverter adapted to invert and output the output signal of the delayer; and
    an AND gate adapted to perform an AND operation on the received predetermined command and the output signal of the inverter, an output of the AND gate being output as the control signal.

11. A memory system, comprising:
    a memory device including the semiconductor device as claimed in claim 6; and
    a controller adapted to control the memory device, the semiconductor device being adapted to output the internal voltage to the memory device.

12. A semiconductor device, comprising:
    a comparator adapted to compare a reference voltage to a comparison voltage and to output a comparison signal;
    an internal voltage generator adapted to generate and output an internal voltage in accordance with the comparison signal;
    a control signal generator adapted to generate a control signal in a first logic state when performing an over-driving operation and a control signal in a second logic state when performing a sensing operation; and a voltage divider adapted to output a voltage obtained by voltage dividing the internal voltage as the comparison voltage in response to the control signal in the first logic state, and to output the internal voltage as the comparison voltage in response to the control signal in the second logic state, wherein the comparator includes a current controller adapted to control a bias current of the comparator in accordance with the control signal.

13. The semiconductor device as claimed in claim 12, wherein the voltage divider includes:

a first resistive element connected between an output of the internal voltage generator and an output of the voltage divider;

a second resistive element connected to the output of the voltage divider; and a transistor having a first port connected to a second port of the second resistive element, a second port connected to a ground voltage, and a gate connected to the control signal, and wherein at least one of the first and second resistive elements is a resistive element having a fixed resistance or a resistive element having a variable resistance.

14. The semiconductor device as claimed in claim 12, wherein the control signal generator generates the control signal in the first logic state during the over-driving operation and at a predetermined period after the sensing operation starts, and in the second logic state in a period for performing the sensing operation not including the predetermined period.

* * * * *